(12) United States Patent
Anthony

(10) Patent No.: US 9,689,068 B2
(45) Date of Patent: Jun. 27, 2017

(54) DEPOSITION AND PATTERNING USING EMITTED ELECTRONS

(71) Applicant: NanoEdit, LLC, Dallas, TX (US)

(72) Inventor: John Mark Anthony, Austin, TX (US)

(73) Assignee: NanoEdit, LLC, Dallas, TX (US)

( * ) Notice: Subject to any disclaimer, the term of this patent is extended or adjusted under 35 U.S.C. 154(b) by 0 days.

(21) Appl. No.: 14/713,366

(22) Filed: May 15, 2015

(65) Prior Publication Data

US 2015/0329957 A1    Nov. 19, 2015

Related U.S. Application Data

(60) Provisional application No. 61/994,343, filed on May 16, 2014.

(51) Int. Cl.
*B05D 3/06* (2006.01)
*C23C 14/22* (2006.01)
*C23C 14/04* (2006.01)

(52) U.S. Cl.
CPC ............ *C23C 14/221* (2013.01); *C23C 14/04* (2013.01); *C23C 14/048* (2013.01)

(58) Field of Classification Search
CPC ............................ C23C 14/221; C23C 14/048
See application file for complete search history.

(56) References Cited

U.S. PATENT DOCUMENTS 4,193,003 A * 3/1980 Blanchard ............... C30B 31/20
250/492.2
4,463,255 A * 7/1984 Robertson ........... H01J 37/3171
250/251

(Continued)

FOREIGN PATENT DOCUMENTS

EP    0 639 939 B1    4/1999
JP    2000-144433    5/2000
JP    2001-110798    4/2001

OTHER PUBLICATIONS

Andersen, Lars H., and Jakob Bolko. "Radiative recombination between fully stripped ions and free electrons." Physical Review A 42, No. 3 (1990): 1184.

(Continued)

*Primary Examiner* — Dah-Wei D Yuan
*Assistant Examiner* — Nga Leung V Law
(74) *Attorney, Agent, or Firm* — John A. Thomas

(57) ABSTRACT

A method of creating a localized deposition on a sample in a vacuum chamber having an ion source generating a positively-charged beam of ions and a separate source of primary radiation generating a beam of radiation. An ion beam from the ion source is directed toward the sample, and the primary radiation beam is applied to the sample to generate emitted electrons from the sample. The ion beam and the primary radiation beam are positioned so that the paths of at least some of the ions in the ion beam and the paths of at least some of the emitted electrons from the sample substantially overlap in space near the sample surface. The energy of the ions in the ion beam and the electric potential of the sample are adjusted to substantially prevent deposition of ions on the sample. The energy of the ions in the ion beam and the electric potential of the sample are adjusted so that a portion of the ions in the ion beam are neutralized by the emitted electrons from the sample, and such neutralized ions continue in their respective paths to deposit on the sample.

18 Claims, 13 Drawing Sheets

(56) References Cited

U.S. PATENT DOCUMENTS

| | | | | |
|---|---|---|---|---|
| 4,959,544 | A * | 9/1990 | Sukenobu | H01J 49/48 |
| | | | | 250/305 |
| 5,087,476 | A | 2/1992 | Tohma | |
| 5,601,654 | A | 2/1997 | Springer | |
| 6,926,935 | B2 * | 8/2005 | Arjavac | C23C 16/047 |
| | | | | 427/585 |
| 7,651,926 | B2 | 1/2010 | Jacobson | |
| 8,093,144 | B2 | 1/2012 | Jacobson | |
| 8,367,525 | B2 | 2/2013 | Jacobson | |
| 2003/0196602 | A1 | 10/2003 | Shabalin | |
| 2007/0120073 | A1 * | 5/2007 | Peng | H01J 37/304 |
| | | | | 250/492.21 |
| 2011/0101247 | A1 * | 5/2011 | Hilkene | B82Y 10/00 |
| | | | | 250/492.3 |

OTHER PUBLICATIONS

Benninghoven, Alfred, F. G. Rudenauer, and Helmut W. Werner. "Secondary ion mass spectrometry: basic concepts, instrumental aspects, applications and trends." John Wiley & Sons, New York, 1987, p. 165.

Flewitt, P.E.J., et al. "Physical Methods for Materials Characterization." Institute of Physics Publishing, Bristol, 1994, p. 367.

Goldstein, Joseph I., et al. "Scanning Electron Microscopy and X-ray Microanalysis." Plenum Press, New York, 2012, pp. 77, 78, 90.

Utke, Ivo, Patrik Hoffmann, and John Melngailis. "Gas-assisted focused electron beam and ion beam processing and fabrication." Journal of Vacuum Science & Technology B 26, No. 4 (2008): 1197-1276.

* cited by examiner

DEPOSITION AND PATTERNING USING EMITTED ELECTRONS

CLAIM FOR PRIORITY

This application claims the priority of U.S. Provisional Patent Application, Ser. No. 61/994,343, filed May 16, 2014, which provisional application is incorporated by reference into the present application in its entirety.

BACKGROUND

Technical Field

This disclosure relates generally to vacuum-based deposition methods on surfaces, and more specifically to a new patterned-deposition method in instruments such as scanning electron microscopes and related tools.

BACKGROUND

Generation of Secondary Electrons

Vacuum bombardment of solid or liquid samples with charged-particle beams is an extensively studied topic. The interaction of this primary beam with a target leads to a variety of secondary reaction products, and the characteristics of these products have been used to generate many successful commercial instruments for modifying and analyzing materials, including the scanning electron microscope (SEM), the transmission electron microscope (TEM), focused ion beam (FIB) systems, and dual SEM and FIB instruments.

A variety of particles are produced in the interaction region of a solid sample under electron-beam irradiation, including electrons from various mechanisms, X-rays, and optical photons characteristic of the sample materials. The incident primary electron beam experiences collisions as it penetrates the sample, leading to a lateral spread of the beam and a characteristic teardrop shape within the sample. Secondary particles are generated throughout this volume, but the ability of these secondary particles to escape the sample surface will depend on a variety of factors, including, the depth of generation, particle type, particle energy, and emission angle.

In addition to the possible reemergence of the primary electron as a backscattered electron (BSE), electrons are generated all along the path. Some of these electrons have sufficient energy to exit the sample, both at the original point of entry and at the exit point for the backscattered electron.

We may identify three major energy domains in the energy spectrum of electrons emitted during the irradiation process, as follows.

Secondary electrons (SE) are electrons released during the various collision processes the primary beam experiences, which then escape the sample surface. Typical emission energies are ≤50 eV. The SE signal is typically peaked at an energy of a few eV. Most of the secondary electrons that escape from the sample are generated in the first few nanometers of the sample surface.

Auger electrons (AE) are generated from excited atoms created during passage of the primary beam. In some cases the primary electron will excite a core electron in an atom. This core hole can be filled by an outer shell electron, and a second outer shell electron (the Auger electron) can be emitted during this process. The Auger electrons furnish information about the near surface atomic species. Energies will depend on both the element and the particular electron transition, but are typically in the 50 to 2000 eV range.

Backscattered electrons (BSE) may result from multiple small-angle collisions or to one or a few large-angle collisions coupled with the small angle behavior. For very large angle scattering, the BSE energy remains close to the primary energy. Consequently, backscattered electrons will typically have a range of energies up to near the primary beam incident energy. The intensity of the BSE emission is a function of atomic number. Use of a low atomic number substrate will minimize the BSE signal for similar thickness samples, and also minimize the number of secondary electrons caused by backscattered electrons.

Gas Injection Systems

Gas injection systems (GIS) are commonly used on FIB instruments to allow patterned deposition of materials. FIG. 1 illustrates the conventional process. The material of interest is incorporated in a chemical form that can be easily heated to create a modest vapor pressure. This precursor material 100 may be stored in a crucible or similar container attached to the vacuum system. After heating of the material 100 in the crucible to a desired temperature (i.e. to reach the desired vapor pressure), the vapor is injected into the vacuum system, usually through introduction by a fine needle 110 near a solid substrate 120. The vapor cloud is irradiated by the ion beam (typically gallium ions) 130 in the FIB, and in the irradiation region a fraction of the chemical compound is dissociated into constituent parts as a result of interactions between the ion beam 130 and the vapor cloud of precursor material 100. Some of these constituent components 140 will deposit on the substrate 120, while other components 150 are more volatile and will leave the vacuum chamber via the system vacuum pumps.

The deposited material 140 in FIG. 1 may create a stable structure on the substrate 120 if the constituent is stable, or it may lead to chemical reactions with the substrate 120. The deposition region will follow the pattern drawn by the primary ion beam 130. In some cases chemical reactions involving the deposited material 140 may result in localized etch patterns defined by the ion-beam pattern. An example is the introduction of $XeF_2$ gas onto a silicon sample. If the $XeF_2$ is locally dissociated at the sample surface by ion beam irradiation, the fluorine promotes etching of the silicon substrate in those locations, while the excess xenon is pumped away.

There are several challenges associated with these GIS units. For example, it is often difficult to find a chemical compound of appropriate vapor pressure for materials of interest. Deposition of elemental materials (typically platinum, tungsten, cobalt, iron, or gold) often requires the use of metalorganic precursors. Most such precursors are expensive and many are toxic.

Further, for some applications, such as circuit repair in the semiconductor industry, the deposited materials should mimic as well as possible the behavior of the bulk materials. Unfortunately the precursor materials available usually include a large organic component, and some of this material does not volatilize during the deposition process. The result is contamination of the sample by these typically carbon-based species, leading, for example, to higher-resistance metals and lower-resistance insulators.

Further, the use of a gallium-ion source in the typical FIB results in contamination of the sample with Ga metal. In principle, electron beams from SEM systems and related instruments could also be used with GIS hardware. Deposition and etch rates for electrons, however, are typically much lower than for ion beam irradiation, limiting the efficacy of this approach with conventional methods. A method more appropriate for electron-based instruments would be preferable, due to the typically lower cost and larger market penetration of electron-based systems, such as the SEM.

In this application, I disclose a method to address these limitations, so that deposition of a wide variety of new materials is enabled, without the need for complicated or dangerous precursor chemistries, or the contamination of a deposition site with undesired species. Although my process works with ion-primary beams, it is also efficiently enabled by electron-beam irradiation, which can lead to less contamination from the primary beam during the deposition process.

DRAWINGS

Non-limiting embodiments of the present disclosure are described by way of example in the following drawings, which are schematic and are not intended to be drawn to scale:

SUMMARY

Figure 1:
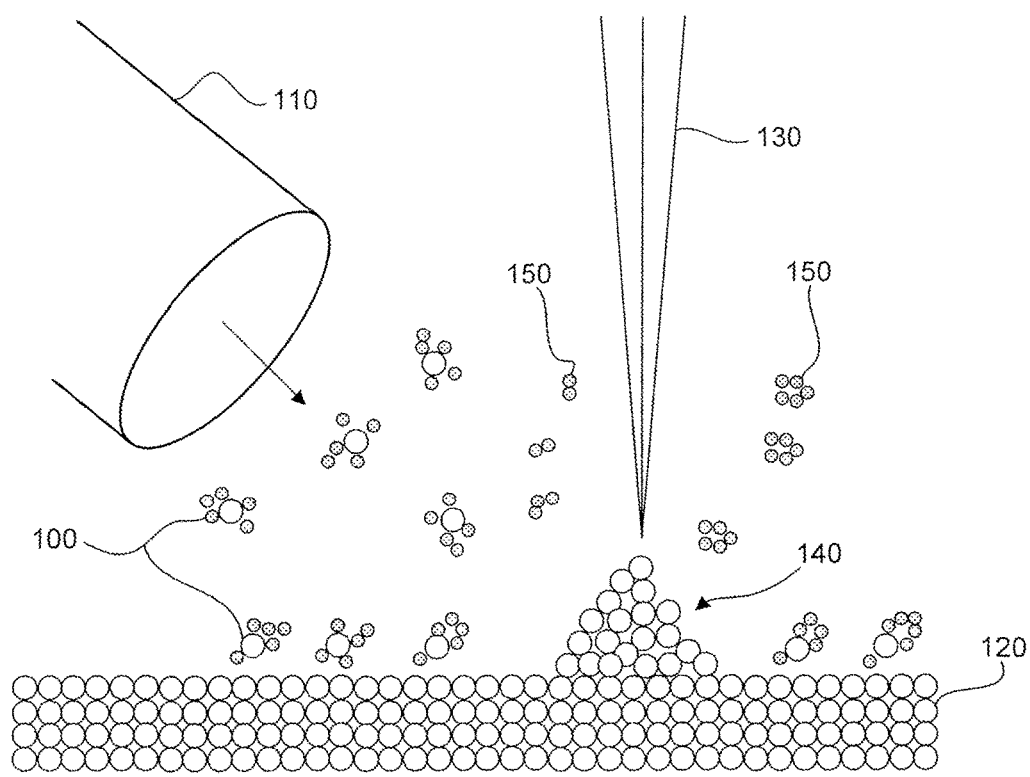
FIG. 1 illustrates prior-art methods of deposition on a substrate.

Generally, an ion source is coupled to the vacuum system of a charged-particle beam instrument and is used to generate a beam of (typically) positive ions. Ion sources of various types are known in art. A non-exclusive example of such a source is the EASY-Spray™ Source manufactured by Thermo Fisher Scientific, Inc. Ions from such a source are directed toward a sample at an area of interest that overlaps with the irradiation area of the primary charged-particle or radiation beam of the instrument.

The ion energy and sample voltage (typically measured with respect to the system ground of the instrument) are chosen such that the ions do not have enough energy for contact, but rather diminish in velocity as they near the sample, before being repelled and accelerating away. The ion trajectory region just before, during, and after the distance of closest approach constitutes a cloud of slow-moving ions. The approach distance will depend on the energy and charge of the ions, coupled with the voltages of the ion source, optics, sample and other surfaces within the vacuum chamber.

The primary particle source directs an ion or electron beam (or, in some embodiments, a photon beam) onto the sample. These primary-beam particles pass through the cloud of ions directly above the sample surface.

The primary particle beam generates secondary radiation from the surface as it penetrates the sample. The energy of this primary beam is sufficient to generate emitted electrons, including secondary electrons, from the sample surface. Emitted electrons are substantially located at the intersection of the primary beam with the sample surface. These emitted electrons are of the several types mentioned above (SE, AE, BSE), and will have a range of energies as described above.

The emitted electrons created by the primary beam will neutralize ions in the ion cloud near the point of impact. These neutralized ions will no longer be repelled by the electric field near the sample. Neutralized ions which have not yet reached the distance of closest approach will continue their passage to the sample surface. A deposition of the neutralized ion material will be formed thereby. The location of the deposited material will be in the sample area near the confluence of the primary beam and the ion beam cloud.

DEFINITIONS

As used in this application, the term "ion source" includes all optics, electronics, vacuum and mechanical components to generate a directed stream of ionized particles. The directed stream of ionized particles is also referred to as an "ion beam," comprising a number of ions. As used in this application, an "ion source" is considered to be the source of ions for deposition.

As used in this application, the term "primary radiation" includes all optics, electronics, vacuum, and mechanical components to generate a directed stream of radiation, including ions, electrons, or photons. As used in this application, "primary radiation" is considered to be the cause of electron emission when it impinges on a sample surface.

As used in this application, the term "atmospheric ion source" means a source where ions are generated at atmospheric pressure and then passed through differential vacuum pumping stages (with appropriate ion optics, electronics, vacuum, and mechanical components) before entry to a main vacuum chamber.

As used in this application, the term "collision cell" refers to a vacuum stage in which ions at a pressure higher than the final deposition pressure are steered through a small exit aperture using RF and DC voltages. The collision cell may also function as a differential pumping stage. Construction using a quadrupole, hexapole, octupole or higher order multipole configuration is common. The ions undergo many collisions with the background gas in the cell, which reduces the energy and the distribution in energy of the ions.

As used in this application, the term "velocity reversal" refers to the point in space where the velocity component of an ion or electron normal to the sample surface changes direction. The horizontal component of velocity parallel to the sample surface may or may not be non-zero at this point. For ions, this position is also described as the "repulsion height".

As used in this application, the terms "pulsed" or "pulsing" refers to a change in value vs. time. This change can be either binary (on or off in some time sequence), or multi-valued (i.e., multiple values appearing as a function of time). Examples using a voltage, for instance, might include a square wave pulse (binary) or a sine wave (multi-valued). Various combinations of sequences, including non-analytic functions, are included.

Unless otherwise stated, as used in this application, the term "vacuum chamber" may refer to the vacuum chamber of a scanning electron microscope (SEM), a transmission electron microscope (TEM), a focused ion beam (FIB) system, or a dual SEM and FIB instrument, or similar or related instruments.

DETAILED DESCRIPTION

Figure 2A:
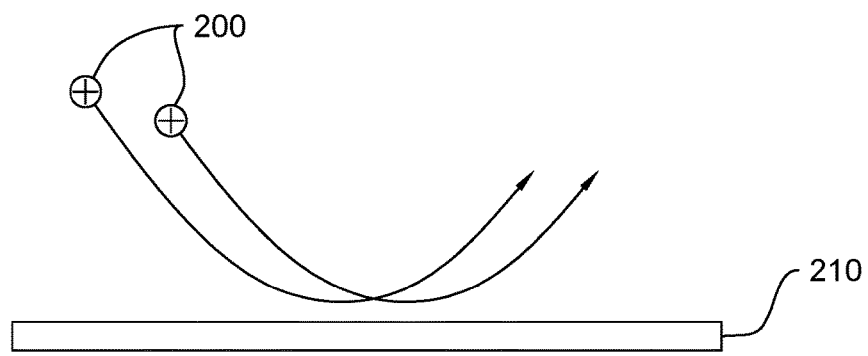
FIGS. 2A, 2B, 2C and 2D illustrate processes of neutralization of positive ions by secondary electrons near a sample surface.

FIGS. 2A through 2D illustrate the general process of neutralization of positive ions by secondary electrons near a sample surface. In FIG. 2A, two singly-charged positive ions 200, each with insufficient energy for landing, are directed toward a sample surface 210. The positively-charged ions 200 have similar energies, and are moving in an electric field between lens surfaces (not shown) held at negative potential and the sample 210, held at ground potential in this example. The electric field creates acceleration for the positively-charged ions 200 directed away from the sample 210, slowing the ion velocity and eventually leading to velocity reversal and repulsion from the sample surface. The projected trajectories of the ions are shown in solid lines in FIG. 2A.

Figure 2B:
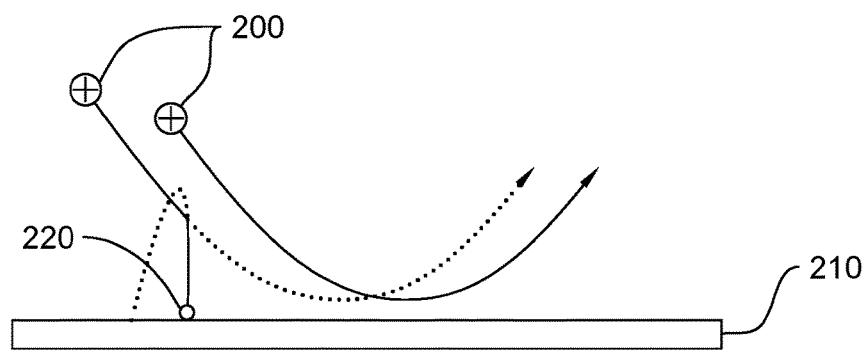

In FIG. 2B, an electron 220 emitted from the sample 210 surface follows a path to intersect one of the positively-charged ions 200. The electron 220 is generated by impact between a primary beam (not shown) and the surface region of the sample 210. The electron 220 has an initial energy as it is emitted, and it also experiences acceleration due to the local electric field between the ion-source lens surface (not shown in these figures) and the sample 210. Since the electron 220 has opposite charge to the positively-charged ions 200, it experiences acceleration back towards the sample 210, which leads to velocity reversal for the electron 220. The dashed lines in FIG. 2B represent the trajectories the positively-charged ion 200 and the electron 220 will follow if there is no interaction between them. Note that the positively-charged ion 200 and the electron 220 are typically moving at different velocities.

Figure 2C:
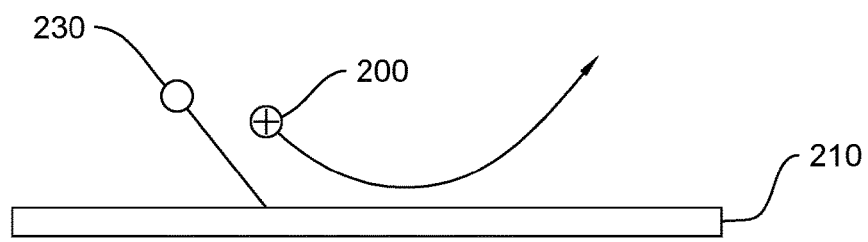

In FIG. 2C, the ion 200 and the electron 220 have combined, and a neutral particle 230 remains. The recombination probability depends strongly on the relative velocity between the ion 200 and the electron 220 (a lower relative velocity implies a higher neutralization probability). Since the electron 220 will usually have much higher velocity than the ion 200 due to the lower mass of the electron 220, neutralization is most likely to occur near the electron 220 velocity-reversal region. If the neutralization event occurs before the ion 200 has been repelled, the resultant neutral particle 230 will still have a residual velocity towards the sample 210 surface, leading to deposition on the surface of the sample 210. The second incident ion 200 depicted in FIG. 2C does not encounter an electron 220 and thus follows the repulsion trajectory.

Figure 2D:
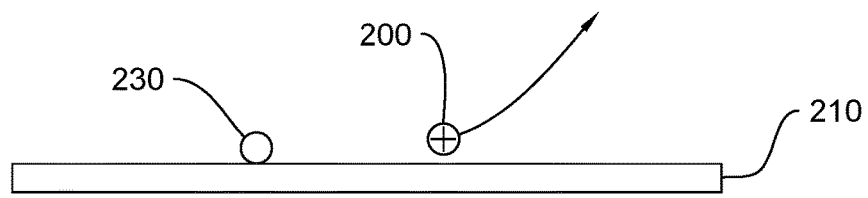

In FIG. 2D, the neutral particle 230 has landed on the surface of the sample 210. The remaining ion 200 has been repulsed and follows its original trajectory away from the sample 210.

Figure 3A:
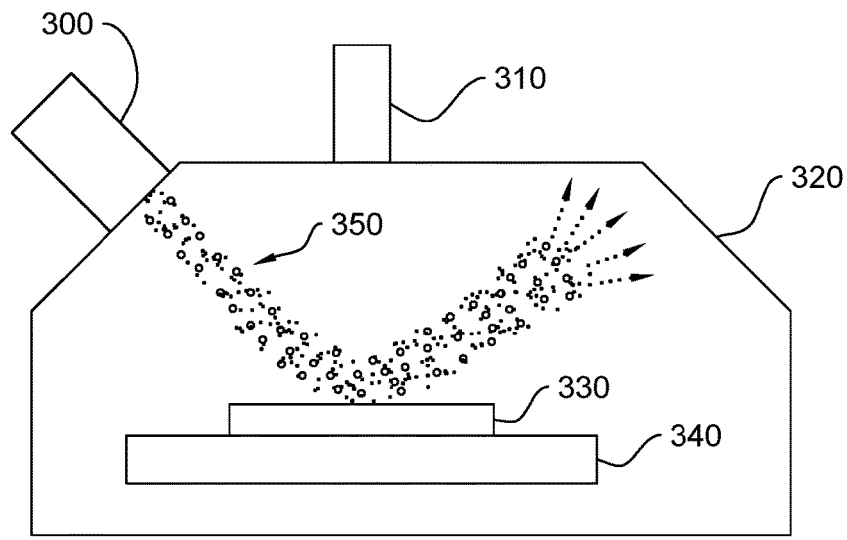
FIG. 3A illustrates an electron source and an ion source mounted on a vacuum chamber, where positive ions are directed at a sample surface.

FIGS. 3-4 show these concepts schematically implemented in a vacuum system such as an SEM with multiple ions and electrons. (An atmospheric ion source with a collision cell as the final differential pumping stage is assumed in this example, but this disclosure is not limited to such sources.) In FIG. 3A, the ion source 300 and electron source 310 are mounted on a vacuum chamber 320. A sample 330 is mounted on a sample stage 340. Positive ions 350 are generated by the ion source 300. These ions may be singly or multiply charged. The ions 350 are directed towards the area of interest on the sample 330.

Figure 3B:
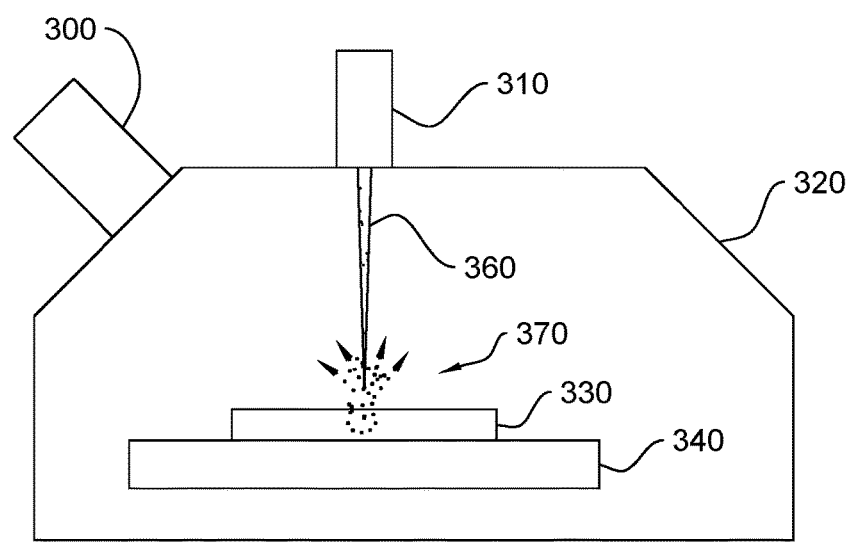
FIG. 3B illustrates the generation of secondary electrons by the striking of an electron beam on the sample surface.

The electric potential of the sample 330 in FIGS. 3A and 3B is held either at ground or at some elevated potential. The energy of the ions 350 is chosen such that they will approach the sample, but do not have sufficient energy to actually land on the sample. (The energy of the ions 350 depends on the voltages used during the ionization process and on their residual energy after suffering collisions in the collision cell of the ion source.) The ions 350 are then repelled by the sample 330 and continue through the vacuum chamber 320. The actual ion trajectory after being repelled by the sample 330 will depend on other surfaces and voltages in the system.

In FIG. 3B, a beam of primary electrons 360 is shown impinging on the sample 330. This beam of primary electrons 360 can generate several types of radiation, including secondary electrons, Auger electrons, or backscattered electrons. The relative energy and intensity of these products will depend on the energy of the primary electron beam 360 and the sample material, but in general the secondary electrons 370 have the highest intensity and the lowest energy (<50 eV). FIG. 3B shows these secondary electrons 370 leaving the sample surface near the primary electron beam 360 impact area. After leaving the sample 330, the trajectory of these secondary electrons 370 will depend on other surfaces and voltages in the chamber, but the density will be high near the surface of the sample 330.

Figure 4A:
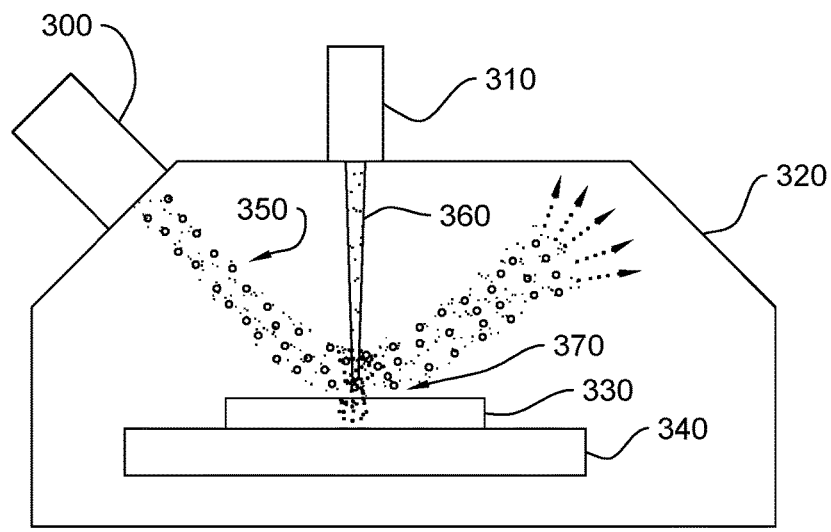
FIG. 4A illustrates simultaneous operation of an ion source and an electron beam in a vacuum chamber having a sample surface.

FIG. 4A shows simultaneous operation for both the ion source 300 and the electron source 310. The cloud of secondary electrons 370 overlaps in space with the ion beam 350 near the surface of the sample 330. The cloud of ions 350 near the surface of the sample 330 may be much larger than the cloud of secondary electrons 370. If advantageous, the electric field above the sample 330 can be adjusted to retard the secondary electrons 370 and adjust the positions and relative velocities of the secondary electrons 370 with respect to the surface of the sample 330 or to the ion beam 350 cloud, or to both. The electric field above the sample 330 depends on all local potentials, including the sample voltage. The energy of the ion beam 350 can be adjusted at the ion source 300 to compensate for changes in the potential of the sample 330.

Figure 4B:
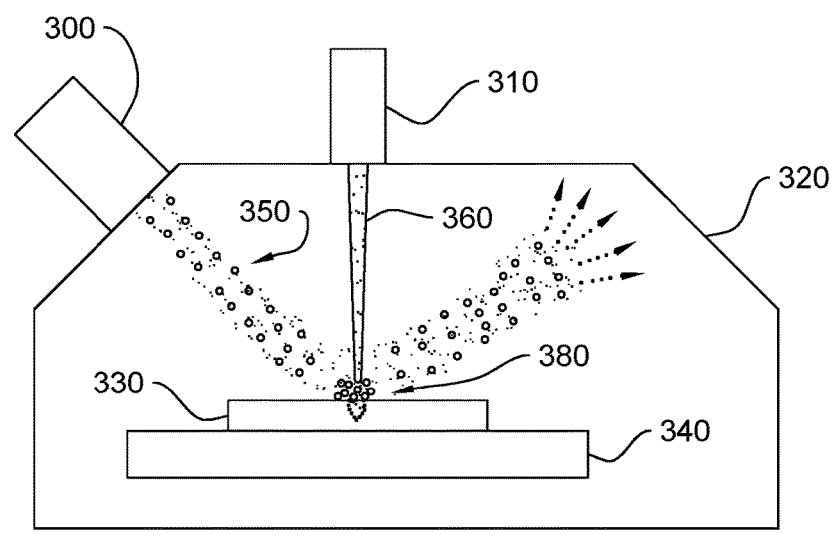
FIG. 4B illustrates the result of the interaction of an ion beam and secondary electrons released in a vacuum chamber.

FIG. 4B shows the result of the interaction between the ion beam 350 and the secondary electrons 370. Ions 350 approaching the surface of the sample 330 in regions of high secondary-electron 370 emissions will have an enhanced probability of capturing one of the secondary electrons 370 and reducing the ion charge. The process is self-regulating, since once an ion of charge +Qe has captured Q electrons, the ion 350 has been converted to a neutral species 380 and to first order no longer attracts electrons 370. These neutral particles 380 will no longer be repelled by the sample 330 and will deposit locally, forming a pattern that corresponds to the pattern of the primary electron beam 360. Other ions 350 approaching the sample 330 away from the primary electron beam 360 interaction area will not be neutralized due to the reduced secondary electron 370 density and high relative electron 370 velocities, and will leave the sample 330 region and pass through the vacuum chamber 320.

Figure 5:
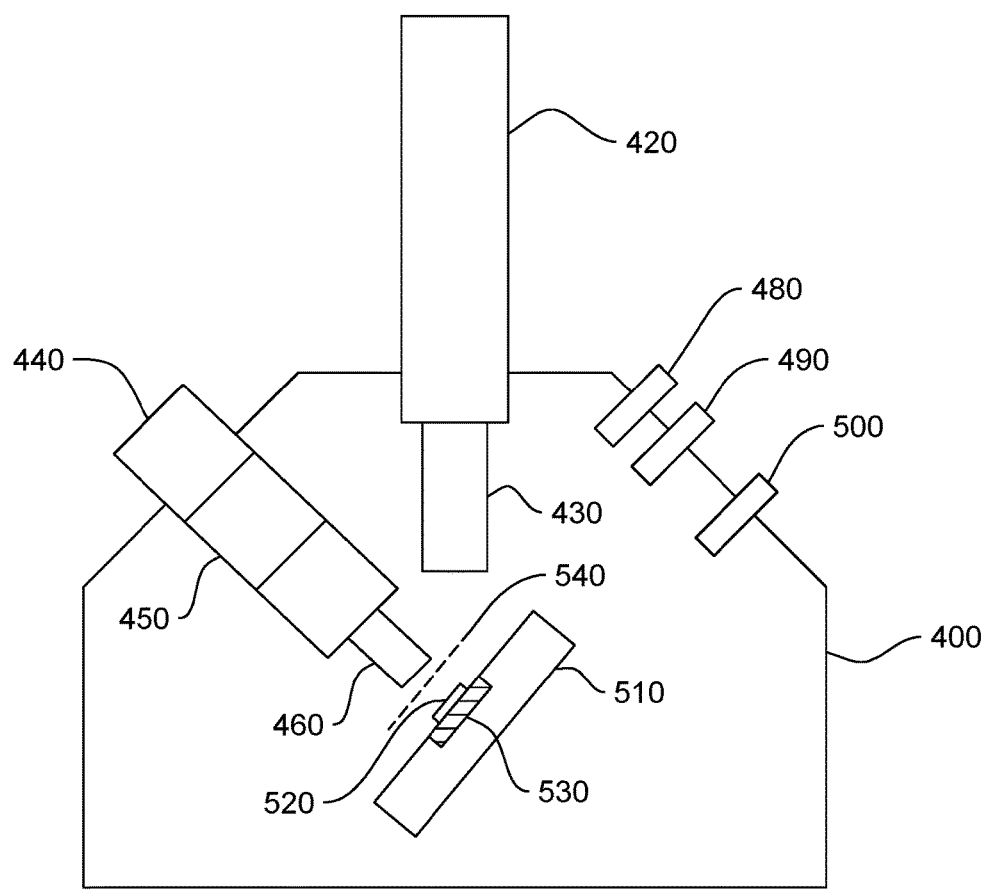
FIG. 5 depicts an example vacuum chamber showing optional features of various embodiments.

In another schematic illustration, FIG. 5 shows an example vacuum chamber 400, having a vacuum pump (not shown) and a primary radiation source 420, the primary radiation source 420 itself having focusing optics 430. An ion source 440 has ion optics 450 and a final lens 460. Between the ion source 440 and the final lens 460 thereof may be optionally a Wien filter 470, discussed below. Typically, such a system will also have an X-ray detector 480, an imaging detector 490 and a video circuit and monitor 500 for direct viewing, although none of the foregoing are required in all embodiments disclosed here. A sample stage 510 will typically allow several degrees of motion, including translation and rotation. Tilting of the sample stage 510, as shown in these figures allows reduced line width for the deposited material. In this example, voltages on the sample stage 510 and the final lens 460 will establish an electric filed substantially normal to the surface of a sample 520.

Figure 6:
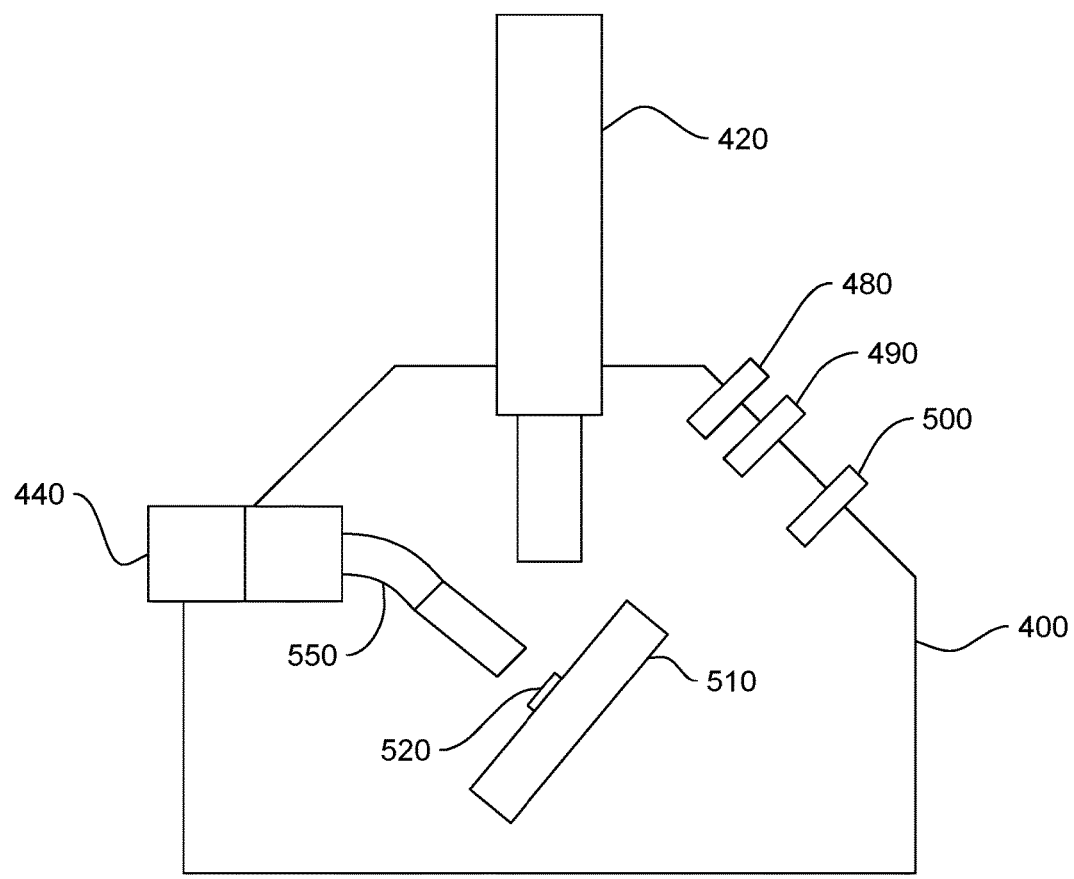
FIG. 6 depicts an example vacuum chamber showing further optional embodiments.

FIG. 5 also shows optional features of other embodiments. Some ion sources produce ions with multiple charge states, and in some cases it may be preferable to choose a single charge state or a few charge states, rather than the entire charge state distribution created by the ion source. A Wien filter 470 is well known in the literature as a velocity selector for charged particles, through the use of crossed electric and magnetic fields. In most cases the multiple charge states produced will have very different velocities, so the Wien filter 470 will function as an efficient charge state selector for these applications. Another optional feature shown in FIG. 5 is a magnet 530, either a permanent magnet or an electromagnet under operator control. The magnetic field from the magnet 530 can modify the trajectories of emitted electrons, enhancing the interaction path length in the neutralization-overlap region between ions and electrons, thus increasing the neutralization probability, leading to increased deposition rates. FIG. 5 also shows an optional ion-transparent, conductive grid 540 to establish a well-defined voltage plane above or near the sample 520, rather than using the voltage of the final lens 460. Finally, in FIG. 6, the example apparatus is shown with the addition of an electrostatic analyzer 550, which is used here as an alternative charge state selector. Since the electrostatic analyzer 550 deflects ions based on their energy divided by their charge, it will not be appropriate for all ion sources. However, ions created at atmospheric pressure and then passed through various collision-based differential pumping stages will have an energy distribution dominated by the collision process rather than the ion charge state. This fact can be used to design an electrostatic analyzer 550 to function as a charge-state selector before deposition on the sample 520. Although this illustration shows a 45 degree deflection of the ion beam by the electrostatic analyzer 550, other deflection angles are of course possible.

Figure 7:
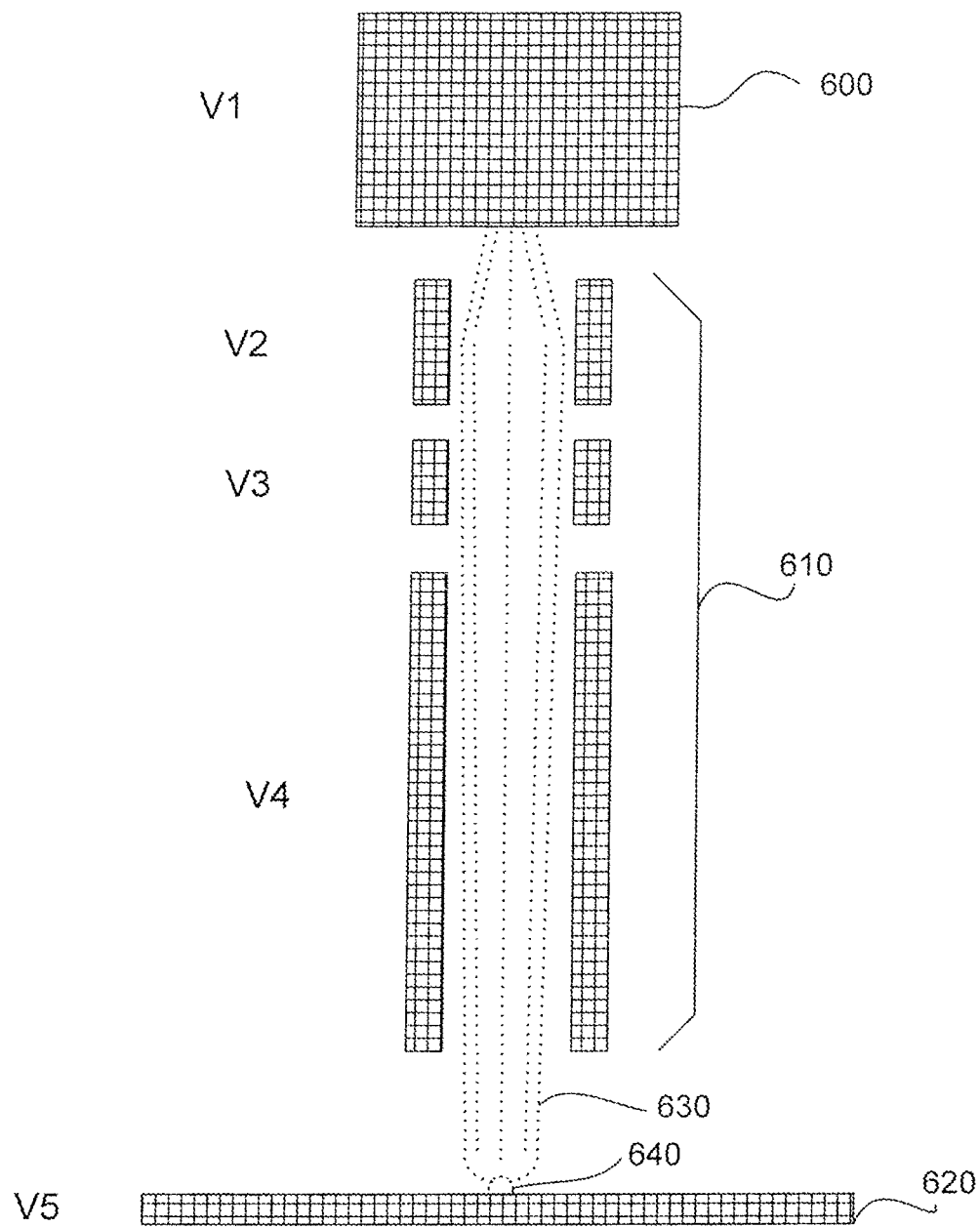
FIG. 7 shows a prototype apparatus for simulation of ion and electron flow in an embodiment.
Figure 8:
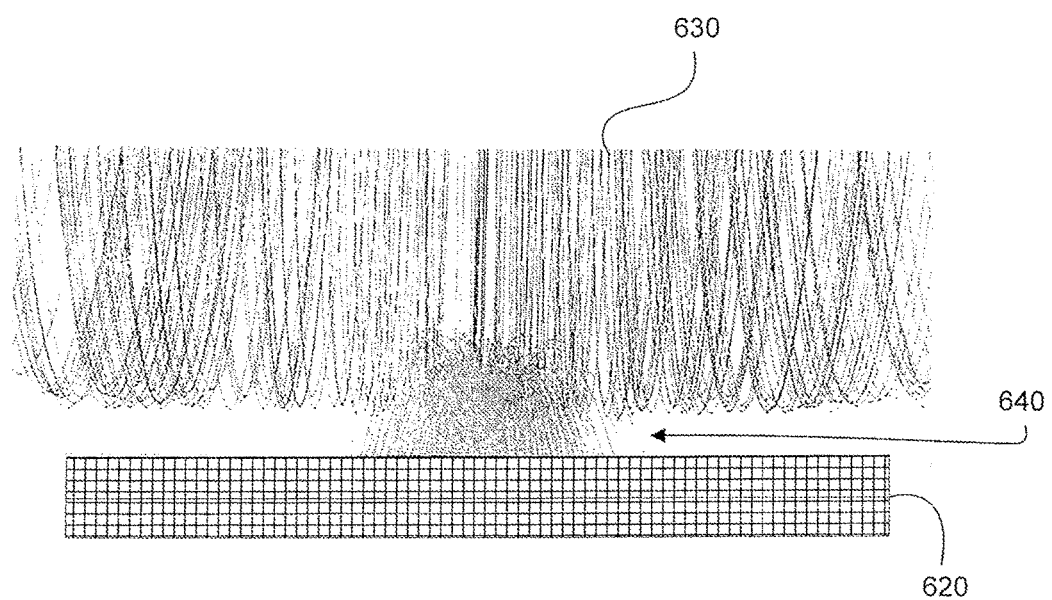
FIG. 8 shows more detail of the simulation of ion and electron flow in an embodiment.

FIGS. 7 and 8 show a simulation of ion and electron flow in a prototype apparatus. The illustrated simulation was performed with the commercially-available SIMION ion simulation program. Actual distances and voltages in different embodiments will vary depending on application constraints, but the simulation depicted illustrates the concepts. Ions are shown in normal incidence for this simulation, since this geometry is expected to yield the minimum line width and maximum resolution when generating patterns, although normal incidence is not required. In this simulation, ions of average energy of 3.5 eV with a Gaussian energy distribution are generated at the exit aperture of an ion source.

Referring to FIGS. 7 and 8, the ion-source exit aperture 600 is held at potential V1. The ion source exit aperture 600 is followed by a typical three-element lens 610, with the three lens components held at voltages of V2, V3 and V4, respectively. The sample 620 is held at potential V5. Ions 630 are emitted from the ion source exit aperture 600 and directed towards the sample. Secondary electrons 640 of average energy 3 eV are emitted from the surface of the sample 620 under irradiation from a primary electron beam (not shown). FIG. 7 shows the overall example geometry. For this particular simulation, voltages of −5, −100, −300, −100 and 0 volts were chosen for V1, V2, V3, V4 and V5, respectively. The charge state of the ions is +1. The ion beam 630 and the emitted secondary electrons are simulated with Gaussian energy distributions of 0.35 eV and 2 eV FWHM, respectively. Note that the ion beam 630 and the emitted secondary electrons 640 overlap near the surface of the sample 620.

FIG. 8 shows magnified details of the interaction region for the ions 630 and secondary electrons 640 near the surface of the sample 620 in this simulation. In general, all beams have both a distribution in energy and in angle. These distributions lead to broadening of the velocity reversal region both laterally along the surface of the sample 620, and in the vertical height above the sample 620. The density of overlap will be high in the central region of the emitted secondary electrons 640, increasing the probability of neutralization. In addition, since neutralization probability varies with velocity, secondary electrons 640 with large horizontal velocities will have reduced probability for neutralization, because even at velocity reversal in the vertical direction, the total horizontal velocity is still large. Secondary electrons 640 emitted closer to normal incidence (and thus with lower horizontal velocity) will thus have lower total velocities at reversal, increasing the neutralization probability in the central region near the axis of the primary electron beam (not shown).

In general, the energy distributions of secondary electrons from either electron-primary beams or from ion-primary beams are fairly similar and well defined. This is not surprising, since the electron-generation mechanisms (collisions of the primary beam within the sample) are similar in these two instances. The energy spread for ion sources is much more varied, however, since a variety of different methods can be used for ion generation (for example, field emission, plasma, or electron impact). More narrow energy spreads from the ionization process will allow the ion cloud to be moved closer to the sample surface, leading to higher ion densities, higher neutralization rates and smaller line widths for patterned structures. Wider energy spreads may require that the ion cloud be placed further from the sample than desired to prevent contact with the sample from ions at the high energy end of the distribution, leading to reduced line widths during the patterning process.

There are a variety of types of ion sources which create ions at atmospheric pressure, then pass the ions through various differential pumping stages before injection into the vacuum. The pressure reduction in each stage will depend on a variety of factors such as geometry or vacuum pump size, but factors of 100 to 1000 times at each stage are certainly possible. One commonly used differential-pumping stage used with these sources is the collision cell or "collisional-focusing ion guide" mentioned previously. Ions passing through the cell undergo collisions with a background gas, dramatically reducing the ion energy and energy spread before emission through a final aperture. These cells allow the natural spread in ion energies from atmospheric ion generation to be reduced to full-width at half-maximum values (FWHM) of about <0.5 eV, which is typically much smaller than the few eV energy spread available directly with the vacuum ionization methods mentioned above. Atmospheric ion sources such as electrospray-ionization, atmospheric-pressure chemical ionization, or atmospheric-pressure photo ionization coupled with the collision cell or similar technology will provide low energy spread sources for a variety of materials.

Figure 9:
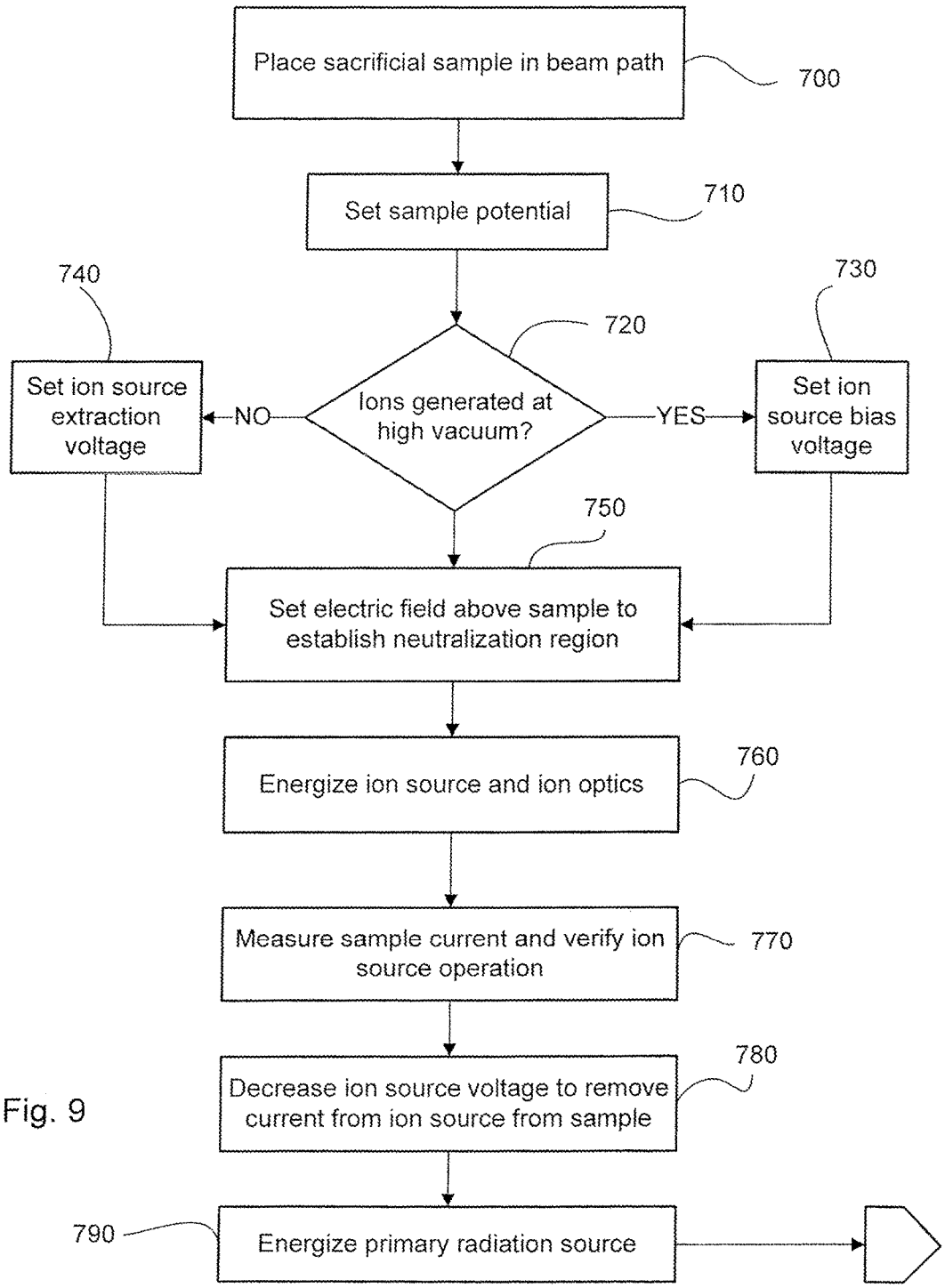
FIG. 9 (of two sheets) is a flowchart depicting method steps in the carrying out of an embodiment.
Figure 9:
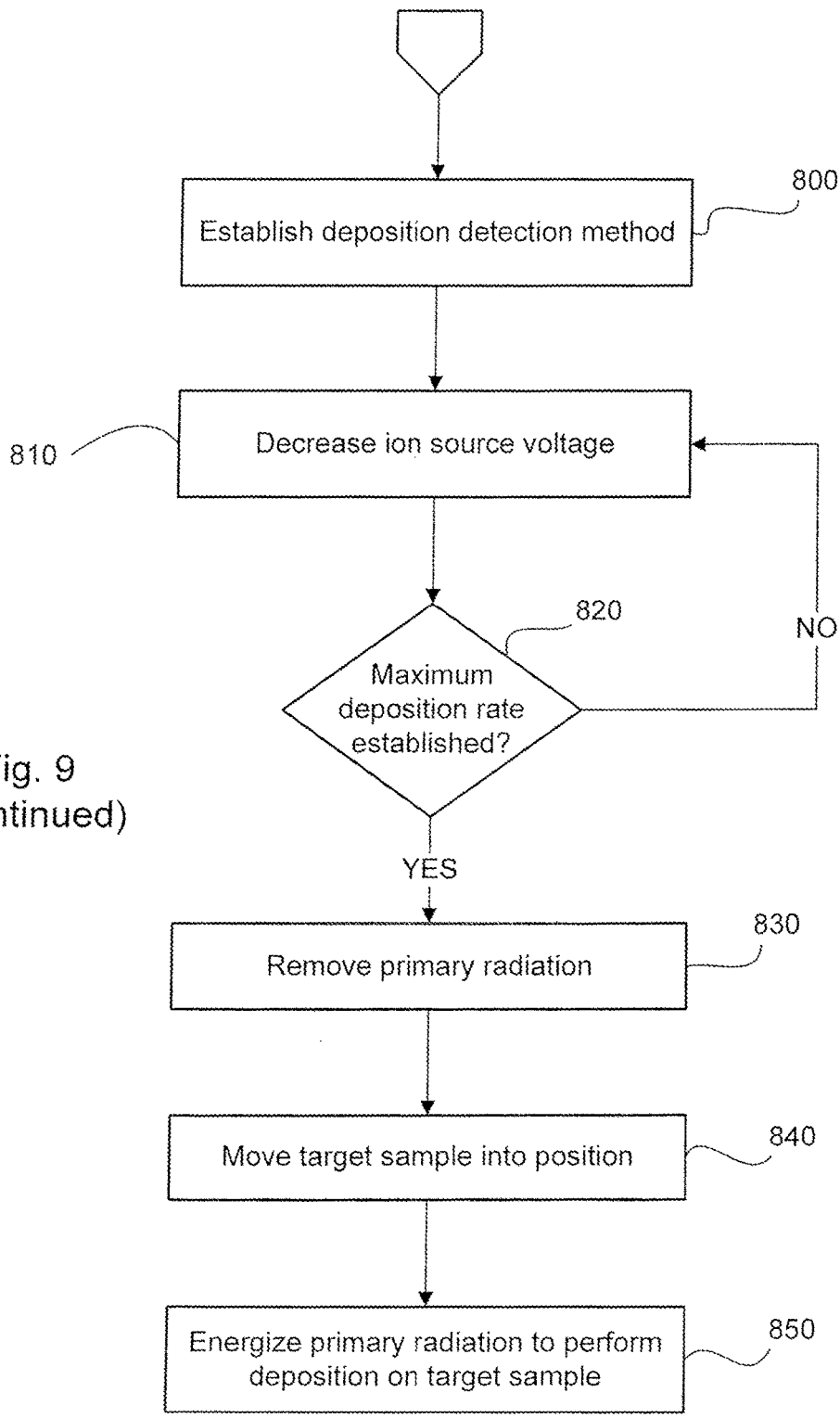

FIG. 9 is a flowchart depicting steps of an embodiment for enabling deposition using the methods disclosed. A sacrificial sample is placed in the beam path in step 700. The sample potential is set in step 710. At step 720, a decision is made whether the ions are generated at high vacuum or at near atmospheric pressure. If the ions are generated at high vacuum, the process sets the ion-source bias voltage at step 730. Otherwise, the ion-source extraction voltage is set at step 740. Action at step 720 depends on the type of ion source used for deposition. For high-vacuum ion source, the ion-source bias voltage will be set at the same value as the sample potential. For atmospheric pressure-type ion sources, the ion-source extraction voltage (such as at the exit aperture of a collision cell) will be set at the same value as the sample potential.

The process continues at step 750 where an electric field is set above the sample so as to establish the location of the ion neutralization region. Thereafter, the ion source and ion optics are energized at step 760.

The operator (or an automated system) measures sample current and verifies ion-source operation at step 770. The ion-source voltage is decreased to remove the ion current in the sample at step 780. This step 780 reduces the ion energy of the ion beam to guarantee repulsion of the ion cloud. In the next step 790, the primary radiation source is energized. In the next step 800, the operator establishes the deposition detection method, for example, energy-dispersive X-ray detection. (Of course, the choice of detection method in step 800 could have been made before beginning the procedure.) Step 800 includes turning on the chosen detector hardware and software and verifying that there is a detector signal. In step 810 the ion-source voltage is decreased. Checking at step 820, the deposition rate is measured and compared to previous values. If the maximum deposition rate has been established, the process continues to step 830; if not, then the source voltage is again decreased at step 810 and the deposition rate is re-measured at step 820. Once the maximum deposition rate is found at step 820, primary radiation is removed at step 830 and the target sample for deposition is moved into position at step 840. The primary radiation is again energized as step 850 to perform deposition on the target sample.

Note that the methods disclosed here also accept a variety of charge states in the ion beam, although the charge state variation will lead to a small spread in the velocity reversal height above the sample. If the energy from the ionization process itself is ignored, positive ions emitted from an ion source at some potential V1 will not be able to move to a higher positive potential V1+ΔV, for any charge state. In practice, using the simulation parameters of FIGS. 7 and 8, and referring thereto as an example, all ions 630 emitted from the ion-source exit aperture 600 at a potential of −5 V (see FIG. 7 discussion above) will pass through the system until they reach a similar −5 V potential above the sample 620. At this point the remaining energy of the ions 630 will solely be the energy from the ionization process, typically on the order of a few eV. The ions 630 will continue toward the sample 620 until this energy has been reduced to zero by deceleration in the electric field between sample 620 and final lens at potential V4. The deceleration will be proportional to charge state, leading to larger deceleration (and a larger height above the sample 620 at velocity reversal) for larger charge states For the example shown in FIGS. 7 and 8, the variation in height between positive ions 630 with charge state +1 and +5 is a few hundred microns. The cloud of secondary-electrons 640 above the sample 620 can be adjusted to accommodate a range of charge states and repulsion heights.

Pulsing of the ion beam 630 and some or all of the associated voltages may also be advantageous in some situations. For example, in an SEM, secondary electrons 640 are routinely used to image a sample; typically by placing a positive bias on an electrode to attract the secondary electrons 640 to a detector 490 (see FIGS. 5 and 6). This voltage may interfere with normal operation by making it difficult to do imaging and deposition at the same time. Also, the presence of non-zero voltages on the ion lens components (see FIG. 7 as an example) may prevent the collection of secondary electrons 640 at the secondary-electron detector 490 even if an embodiment is not operational; that is, no ion beam 630 is incident. One solution to this problem is the pulsing of the voltages in an alternating fashion, where the apparatus deposits for a short time, then the lens voltages are turned off, the secondary-electron collection voltages for imaging are turned on, and the sample 620 is imaged. The voltages at the ion-source exit aperture and all other relevant ion-source voltages can be adjusted to prevent ion-beam release during SEM imaging mode. Pulsing of the voltage on the sample 620 in concert with the other electrodes may also be advantageous in some situations.

Figure 10:
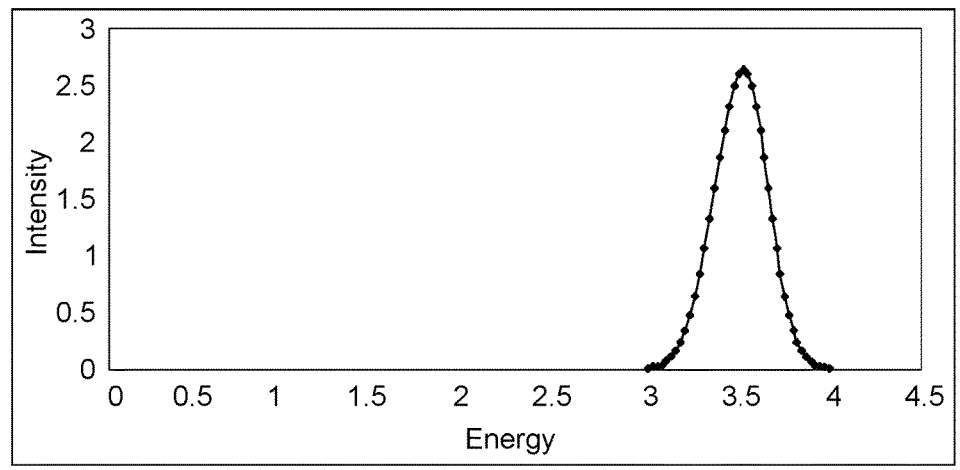
FIG. 10 is a graph depicting a Gaussian energy distribution for an ion beam under certain conditions.

These concepts are illustrated in FIGS. 10-14. FIG. 10 shows a Gaussian energy distribution for an ion beam with a peak at 3.5 eV and a FWHM of 0.35 eV. This energy distribution is generated by the ionization process (possibly coupled with passage through a collision cell or similar apparatus). In addition to the energy distribution, it is possible for the ionization process to generate ions with multiple charge states.

As mentioned above, different charge-state ions passing through an ion source will experience repulsion above the sample at different heights. Although the electron cloud can be adjusted to accommodate this height variation, a strategy to minimize the height difference may be valuable in some situations.

One possible strategy for addressing this variation is to recognize that different charge state ions pass through the system geometry at different speeds, so the time to travel from source emission (V1 region in FIG. 7, for example) to repulsion above the sample will vary with charge state. Higher charge-state ions of the same mass will experience larger accelerations from the electric fields of the system, leading to shorter flight times.

Figure 11:
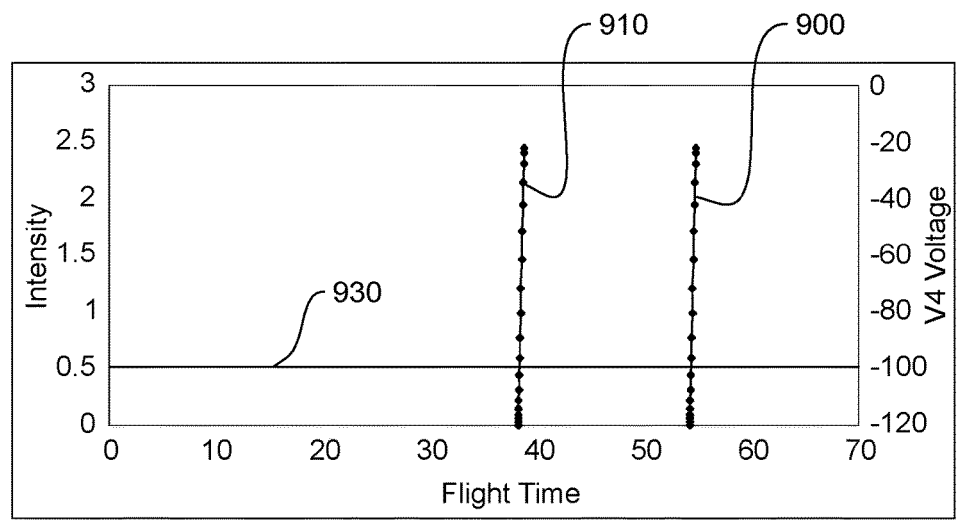
FIG. 11 is a graph illustrating the flight time from source to repulsion for two groups of ions.

FIG. 11 shows the flight time from source to repulsion (referring to the example structure of FIG. 7) for two groups of ions, each with the energy distribution of FIG. 10, but with different charge states. Here a first charge state 900 has charge Q=+1 and a second charge state 910 has charge Q=+2. If we assume a brief pulse of ions is emitted from the source, the +2 ions 910 from this pulse will arrive at the repulsion height well before the +1 ions 900. The energy variation from FIG. 10 has a small effect on flight times, which depend more on total system geometry and voltages. Note that the voltage 930 on lens element V4 (referring to FIG. 7) is constant in this simulation.

Figure 12:
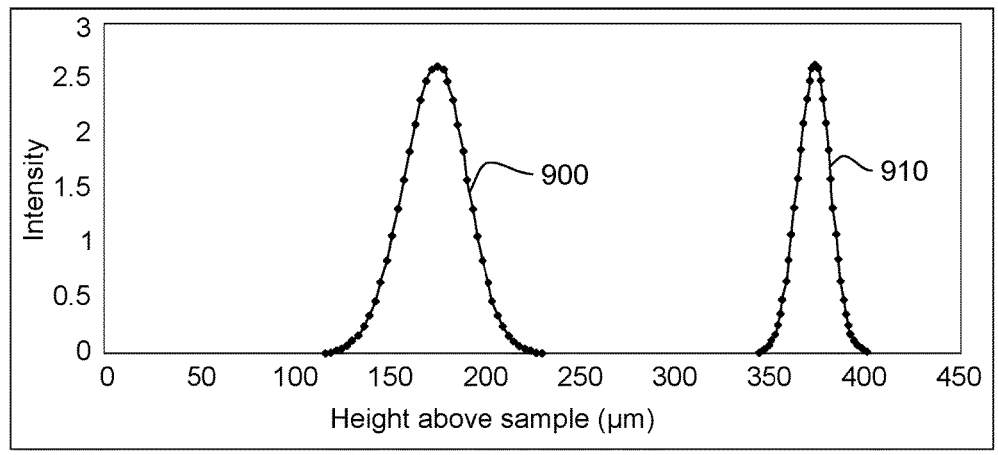
FIG. 12 is a graph illustrating variability in velocity reversal heights above a sample for a two different charge state ion groups.

FIG. 12 shows the variability in velocity reversal (repulsion) heights above the sample for the two different charge state groups just described. Note that, as opposed to the flight times, the height distribution clearly reflects the energy distribution shown in FIG. 10.

Figure 13:
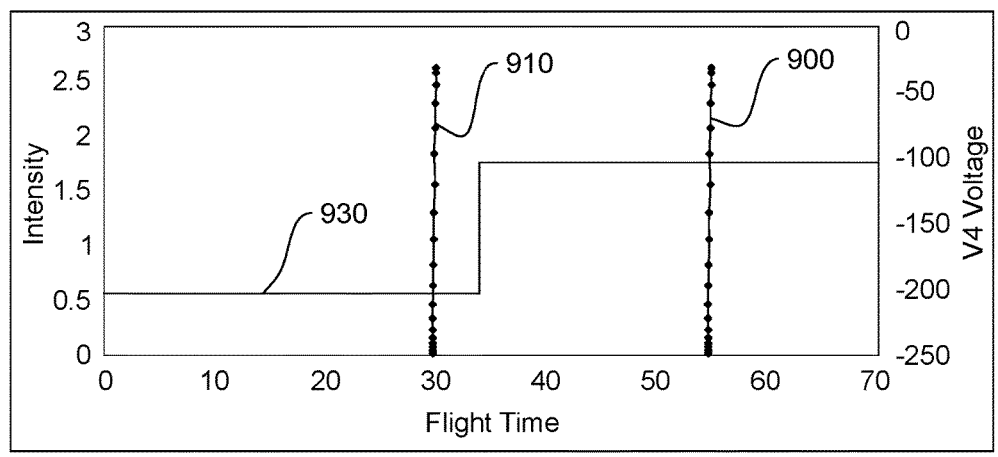
FIG. 13 is a graph illustrating an embodiment where different electric fields may be provided for ions in different charge states.

Since there is a clear difference in flight times between ions with the first charge state 900 (Q=+1) and the second charge state 910 (Q=+2), the possibility exists to provide different electric fields in the sample region for the two different ion groups. FIG. 13 shows a strategy to address this, in which the voltage 930 on element V4 is varied between the value shown in FIG. 7 (−100 V) and a more negative value (−200 V). The V4 voltage is returned to the −100 V value before the +1 ion group reaches the near sample region, preventing a change in flight time for these ions. This voltage sequence has several effects as described in the following paragraphs:

The flight time for the ions with the second charge state 910 (Q=+2) is reduced by the higher electric field in the near sample region as these ions approach the velocity reversal position. For this particular case, the flight time is reduced approximately 25% (FIG. 13 vs. FIG. 11).

Figure 14:
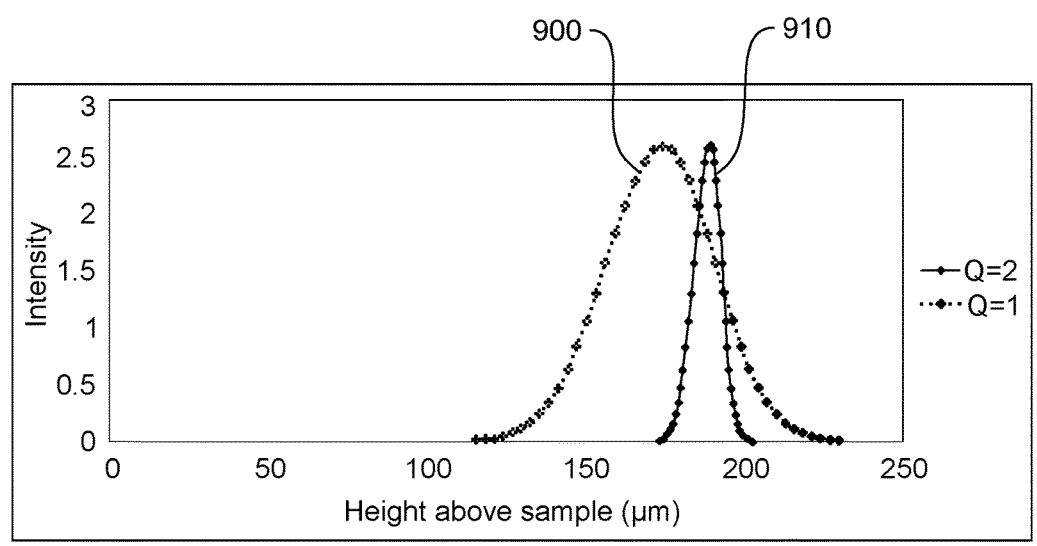
FIG. 14 is a graph illustrating velocity reversal heights for the timing sequence of FIG. 13.

The height above the sample for repulsion of the ions with the second charge state (Q=+2) has been reduced. FIG. 14 shows the simulated heights with the timing sequence of FIG. 13. There is now substantial overlap between the ions of the first charge state 900 (Q=+1) and the second charge state 910 (Q=+2) above the sample region. The repulsion height of the ions with the second charge state 910 (Q=+2) has been reduced by approximately two times.

The emitted electron distribution (not shown) will vary as the V4 voltage is adjusted, which may affect the neutralization probabilities for the ions with the second charge state 910 (Q=+2). This can be partially compensated for by adjusting other voltages and optimizing for a different portion of the emitted electron energy distribution.

The line width of generated patterns will be reduced due to the closer approach of the ions with the second charge state 910 (Q=+2).

Although the strategy in FIGS. 10-14 involves a pulsed beam, which will reduce deposition rates, some applications will find the reduction of line width during the patterning process to be an acceptable tradeoff. More complicated pulsing strategies may be employed for other situations, ranging from a simple binary voltage on one component to a multi-valued sequence of adjustable voltages on multiple components. An example might be a strategy to compensate for the native energy distribution of the ion beam by continuously varying the sample or lens voltages, or both, to narrow the distribution in repulsion heights for a single charge state ion group.

One interesting feature of note in FIG. 14 is the narrow height above sample distribution for the ions with the second charge state 910 (Q=+2). Although the first charge state ions 900 and the second charge state ions 910 have the same native energy distribution in this example, the increased charge state for the ions with the second charge state 910 leads to a compression in height distribution (due to both the increased field as well as increased deceleration from the charge state). This offers the possibility of choosing a single high charge state for some applications to narrow the height-above-sample distribution and move the ion cloud closer to the sample surface, leading to reduced line width patterns.

Although many of the examples mentioned previously use a primary electron beam 360 to stimulate secondary electrons 370 (referring here to FIGS. 3B-4B), it is clear that other configurations are also possible. Some other embodiments are described in the following paragraphs:

Any radiation capable of stimulating secondary electrons can be used as the primary beam. This includes electrons, ions, other charged particles, or photons such as laser radiation.

Moving either the primary beam or the sample allows the deposition of patterns on the sample.

The sample potential could be adjusted (in concert with the ion beam energy) to use different types of emitted electrons for neutralization, including Auger electrons and backscattered electrons.

The sample potential can also be adjusted (in concert with the ion beam energy) to modify emitted electron trajectories and maximize the ion neutralization probability.

The orientation of the ion beam, irradiation beam and sample or sample stage can be varied from the configurations shown.

The injected ion beam can be coupled with more than one primary beam (such as a dual beam FIB and SEM) for operation.

The sample material (bulk or localized) can be chosen to have low atomic number, thereby minimizing the fraction of backscattered electrons, which decreases the spatial width distribution of emitted electrons and improves resolution.

The sample material, when insulating, may be heated to increase local conductivity, thus partially avoiding electric field distortion due to the presence of an insulator. Also, a sample may be cooled, which will increase the probability that a neutralized ion will stick to the sample, known as the sticking coefficient. Samples may be heated by built-in heaters in a sample stage, or additional resistive heaters, for example. Samples may be cooled by various means known in the art, such as by flowing nitrogen gas over the sample.

Magnetic fields (permanent magnets or electromagnets) near the sample could be used to modify the secondary electron trajectories and enhance the electron capture probability.

Geometry modifications of either lens or sample could be used to modify secondary electron trajectories and increase neutralization rates.

Slight tilting of the sample normal away from the ion beam axis may be useful to control the trajectories of ions repulsed by the sample.

None of the description in this application should be read as implying that any particular element, step, or function is an essential element which must be included in the claim scope; the scope of patented subject matter is defined only by the allowed claims. Moreover, none of these claims are intended to invoke paragraph six of 35 U.S.C. Section 112 unless the exact words "means for" are used, followed by a gerund. The claims as filed are intended to be as comprehensive as possible, and no subject matter is intentionally relinquished, dedicated, or abandoned.

I claim:

1. A method of creating a localized deposition on a sample in a vacuum chamber; the vacuum chamber having an ion source generating a positively-charged beam of ions; the vacuum chamber having a separate source of primary radiation generating a beam of primary radiation; the method comprising:

directing the ion beam from the ion source toward the sample;

applying the primary radiation beam to the sample to generate emitted electrons from the sample;

positioning the ion beam and the primary radiation beam so that the paths of at least some of the ions in the ion beam and the paths of at least some of the emitted electrons from the sample overlap in space near the sample surface;

adjusting the energy of the ions in the ion beam and the electric potential of the sample to prevent deposition of ions on the sample; and, adjusting the energy of the ions in the ion beam and the electric potential of the sample so that a portion of the ions in the ion beam are neutralized by the emitted electrons from the sample, and such neutralized ions continue in their respective paths to deposit on the sample.

2. The method of claim 1, further comprising varying the position of the primary radiation beam on the sample to create a pattern of deposition.

3. The method of claim 1, further comprising varying the position of the sample within the vacuum chamber to create a pattern of deposition.

4. The method of claim 1, further comprising adjusting the electric potential of the sample to that of the ground potential of the vacuum chamber.

5. The method of claim 1, further comprising adjusting the electric potential of the sample to a positive potential with respect to the ground potential of the vacuum chamber.

6. The method of claim 1, further comprising adjusting the electric potential of the sample to a negative potential with respect to the ground potential of the vacuum chamber.

7. The method of claim 1, further comprising pulsing the electric potential of the sample with respect to the ground potential of the vacuum chamber.

8. The method of claim 1, further comprising varying the relative angle between the axis of the ion beam and the normal to the surface of the sample between a position where the axis of the ion beam is normal to the surface of the sample and up to, but not including, parallel to the surface of the sample.

9. The method of claim 1, further comprising varying the relative angle between the axis of the primary radiation beam and the normal to the surface of the sample between a position where the axis of the primary radiation beam is normal to the surface of the sample and up to, but not including, parallel to the surface of the sample.

10. The method of claim 1, further comprising applying a magnetic field to modify the paths of the emitted electrons.

11. The method of claim 1, further comprising applying an electric potential to an ion-transparent conductive grid placed above the sample.

12. The method of claim 11, further comprising pulsing the electric potential applied to the ion-transparent conductive grid.

13. The method of claim 1, where the ion source further comprises a plurality of electric potentials, and the method further comprises pulsing the plurality of electric potentials together.

14. The method of claim 1, where the ion source further comprises an electrostatic analyzer, and the electrostatic analyzer is adjusted to select a single ion charge state for the ion beam.

15. The method of claim 1, where the ion source further comprises an electrostatic analyzer, and the electrostatic analyzer is adjusted to select a range of ion charge states for the ion beam.

16. The method of claim 1, where the ion source further comprises a Wien filter, and the Wien filter is adjusted to select a single ion charge state for the ion beam.

17. The method of claim 1, where the ion source further comprises a Wien filter, and the Wien filter is adjusted to select a range of ion charge states for the ion beam.

18. The method of claim 1, further comprising adjusting the temperature of the sample.

* * * * *